(12) United States Patent
Tailliet

(10) Patent No.: US 11,815,547 B2
(45) Date of Patent: Nov. 14, 2023

(54) TEST CIRCUIT

(71) Applicant: STMICROELECTRONICS (ROUSSET) SAS, Rousset (FR)

(72) Inventor: Francois Tailliet, Fuveau (FR)

(73) Assignee: STMICROELECTRONICS (ROUSSET) SAS, Rousset (FR)

( * ) Notice: Subject to any disclaimer, the term of this patent is extended or adjusted under 35 U.S.C. 154(b) by 0 days.

(21) Appl. No.: 17/468,377

(22) Filed: Sep. 7, 2021

(65) Prior Publication Data

US 2022/0107356 A1 Apr. 7, 2022

(30) Foreign Application Priority Data

Oct. 1, 2020 (FR) ...................................... 2010070

(51) Int. Cl.
*G01R 31/28* (2006.01)
*G01R 1/067* (2006.01)
(52) U.S. Cl.
CPC ..... *G01R 31/2884* (2013.01); *G01R 1/06766* (2013.01); *G01R 31/2889* (2013.01)
(58) Field of Classification Search
CPC ............ G01R 31/2812; G01R 31/2884; G01R 31/28; G01R 31/52; G01R 31/50; G01R 31/00; G01R 31/3008; G01R 31/3004; G01R 31/2601; G01R 31/26; G01R 31/58; G01R 31/2882; G01R 31/2856; G01R 31/2889; H01L 22/34; H01L 2924/00; H01L 2924/0002; H01L 22/14; H01L 22/00; H01L 2224/94; H02H 3/335; G11C 29/50
See application file for complete search history.

(56) References Cited

U.S. PATENT DOCUMENTS

| | | | |
|---|---|---|---|
| 6,124,143 | A | 9/2000 | Sugasawara |
| 6,163,867 | A | 12/2000 | Miller et al. |
| 6,449,748 | B1 | 9/2002 | Jeng et al. |
| 6,621,280 | B1 | 9/2003 | Ryan et al. |
| 7,583,093 | B2 | 9/2009 | Tailliet |
| 2006/0038580 | A1 | 2/2006 | Hasegawa et al. |
| 2007/0257353 | A1* | 11/2007 | Park ................... G01R 31/2884 324/762.01 |
| 2009/0174426 | A1 | 7/2009 | Matoba et al. |
| 2010/0117678 | A1 | 5/2010 | Nakabayashi |

(Continued)

FOREIGN PATENT DOCUMENTS

| | | | |
|---|---|---|---|
| CN | 107728042 A | * 2/2018 | ......... G01R 31/2851 |
| EP | 0 288 804 A2 | 11/1988 | |

OTHER PUBLICATIONS

Espacenet Translation—Description CN107728042A, Accessed https://worldwide.espacenet.com/, Oct. 18, 2022 (Year: 2022).*

*Primary Examiner* — Son T Le
(74) *Attorney, Agent, or Firm* — SEED IP LAW GROUP LLP

(57) ABSTRACT

A test circuit and a method for testing an integrated circuit are provided. The integrated circuit includes a test circuit. The test circuit includes a conductive track extending over at least a portion of the periphery of the integrated circuit, at least one component and an activation circuit adapted to deviating an input data signal into the conductive track during a test mode, and to transmitting the input data signal to the at least one component during a normal operating mode.

20 Claims, 6 Drawing Sheets

(56) References Cited

U.S. PATENT DOCUMENTS

2011/0315986 A1* 12/2011 Kaneda ................ H01L 23/647
  257/E23.002
2013/0026466 A1    1/2013 Pagani

* cited by examiner

TEST CIRCUIT

BACKGROUND

Technical Field

The present disclosure generally concerns integrated circuits and, more specifically, tests of integrated circuits. More particularly, the disclosure concerns tests performed at the end of the manufacturing of an integrated circuit.

Description of the Related Art

In industry, most integrated circuits are manufactured in series. Generally, a plurality of copies of a same integrated circuit are manufactured simultaneously on a same wafer or on a same substrate. The individualization of the circuits is generally one of the last operations of the manufacturing method.

There exist different integrated circuit individualization methods. According to an example, the integrated circuits may be separated from one another by means of a circular saw or, for example, of a technology using a laser and/or a plasma etching.

Integrated circuit individualization methods are not risk-free and may in particular damage the edges of the integrated circuits. As an example, during the use of a circular saw, chippings of materials may damage the edges directly close to the integrated circuits.

It is thus important to provide tests at the end of manufacturing to verify that the formed integrated circuits, and their edges, are intact.

It would be desirable to be able to at least partly improve end-of-manufacturing integrated circuit testing circuits and methods.

BRIEF SUMMARY

An embodiment provides an integrated circuit including a test circuit. The test circuit includes: a conductive track extending over at least part of the periphery of said integrated circuit; at least one component; and an activation circuit adapted to deviating an input data signal into said conductive track during a test mode, and to transmitting the input data signal to said at least one component during a normal operating mode.

According to an embodiment, the circuit further includes an input node receiving the input data signal.

According to an embodiment, the activation circuit includes a first node and a second node, said conductive track being coupled between the first node and the second node.

According to an embodiment, the activation circuit includes a capacitor arranged between the second node and a node receiving a reference potential.

According to an embodiment, the capacitor is selectable via at least one transistor.

According to an embodiment, the activation circuit further includes a first resistor series-coupled with the conductive track.

According to an embodiment, the first resistor is selectable via at least one transistor.

According to an embodiment, the activation circuit includes a second resistor arranged between the second node and a node receiving a reference potential.

According to an embodiment, the second resistor is selectable via at least one transistor.

According to an embodiment, the circuit further includes a circuit for triggering the test mode.

According to an embodiment, the test mode triggering circuit is capable of delivering a test mode signal to the activation circuit.

According to an embodiment, the test mode triggering circuit is adapted to delivering at least one test control signal to the activation circuit.

According to an embodiment, the test circuit is, further, capable of detecting physical damage on the conductive track.

Another embodiment provides a method of operation of an integrated circuit such as described hereabove, including the steps of: deviating an input data signal into a conductive track extending over at least a portion of the periphery of said integrated circuit during a test mode; and transmitting the input data signal to at least one component of the integrated circuit during a normal operating mode.

BRIEF DESCRIPTION OF THE SEVERAL VIEWS OF THE DRAWINGS

The foregoing features and advantages, as well as others, will be described in detail in the following description of specific embodiments given by way of illustration and not limitation with reference to the accompanying drawings, in which.

DETAILED DESCRIPTION

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail. In particular, a data signal transmit and receive chain of an integrated circuit will not be detailed.

Unless otherwise specified, when reference is made to two elements connected together, this means directly connected with no intermediate elements other than conductors, and when reference is made to two elements coupled together, this means that the two elements may be connected or coupled via one or a plurality of other elements.

In the following disclosure, unless otherwise specified, when reference is made to absolute positional qualifiers, such as the terms "front", "back", "top", "bottom", "left", "right", etc., or to relative positional qualifiers, such as the terms "above", "below", "upper", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

Figure 1:
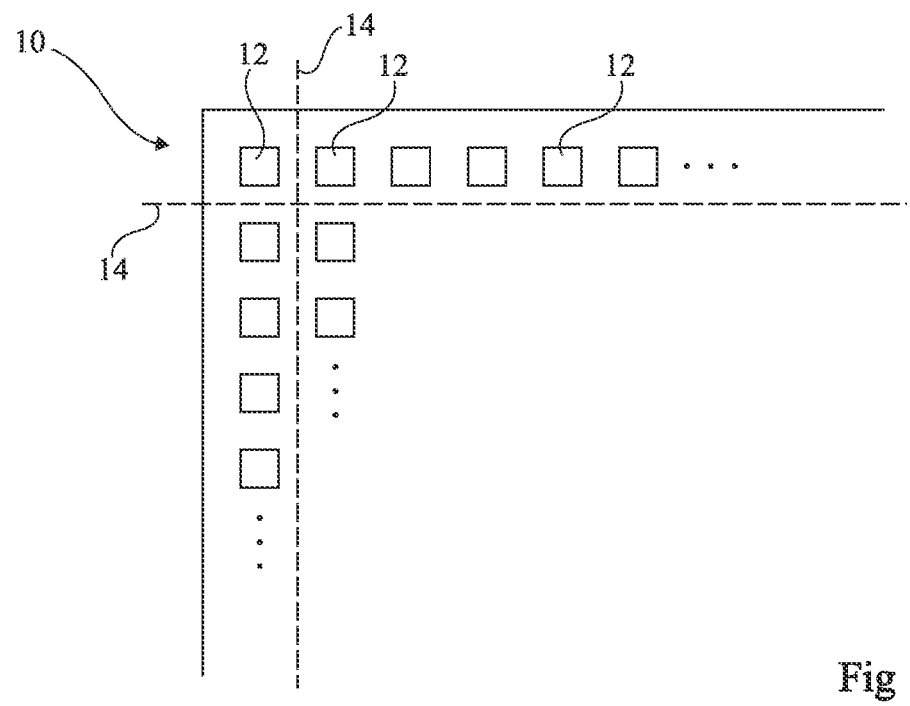
FIG. 1 schematically shows a block diagram of a top view of a substrate.

FIG. 1 is a simplified block diagram of a top view of a substrate 10 having integrated circuits 12 manufactured inside and on top thereof. Only a portion of substrate 10 is shown in FIG. 1.

Integrated circuits 12 are arranged in rows and in columns. Integrated circuits 12 are for example identical circuits manufactured in series inside and on top of substrate 10, but may as a variant be different circuits, however, for example, of similar size to be able to optimize the distribution of circuits 12 on substrate 10.

Once the manufacturing of circuits 12 is over, they should be individualized to be able to be used. For this purpose, the substrate may be cut along cutting lines 14 designated in dotted lines in FIG. 1. These cutting lines delimit, for example, the rows and the columns of integrated circuits 12. There exist different cutting methods. It is possible to use a circular saw, at the adapted dimensions, to cut integrated circuits 12. This is an efficient and inexpensive method, but which is likely to damage integrated circuits 12. Indeed, chippings of material of the edges of integrated circuits 12 are likely to be torn off during the cutting by the jigsaw. Circuits 12 are generally covered with at least one protection layer, for example, a passivation layer, or with a package, but a chipping may nevertheless damage the circuit edges.

Figure 2:
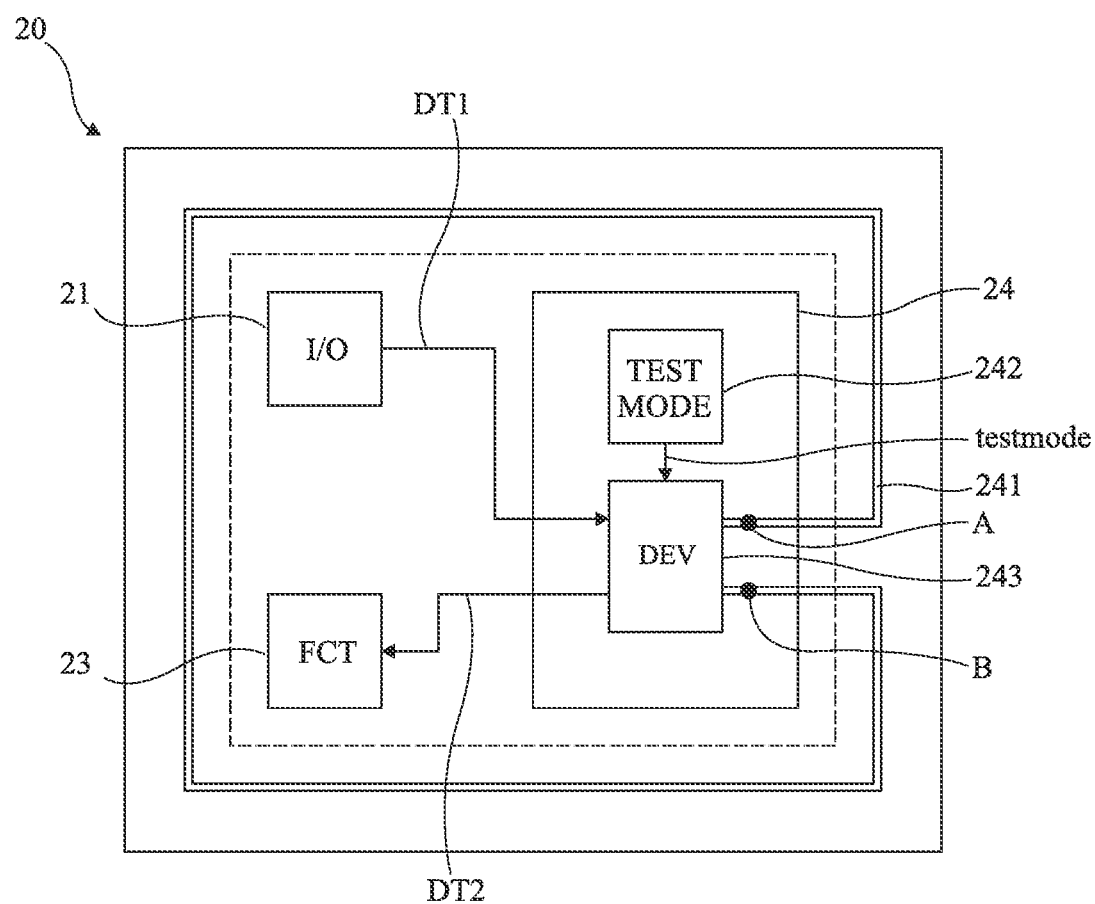
FIG. 2 schematically shows a block diagram of an embodiment of an integrated circuit.

FIG. 2 is a simplified block diagram of a top view of an embodiment of an integrated circuit 20 capable of being manufactured in series like the integrated circuits 12 described in relation with FIG. 1.

Integrated circuit 20 is an integrated circuit capable of receiving one or a plurality of input data signals. For this purpose, integrated circuit 20 comprises a signal transmit and receive chain formed of one or a plurality of signal transmit and receive circuits 21 (I/O).

Figure 3:
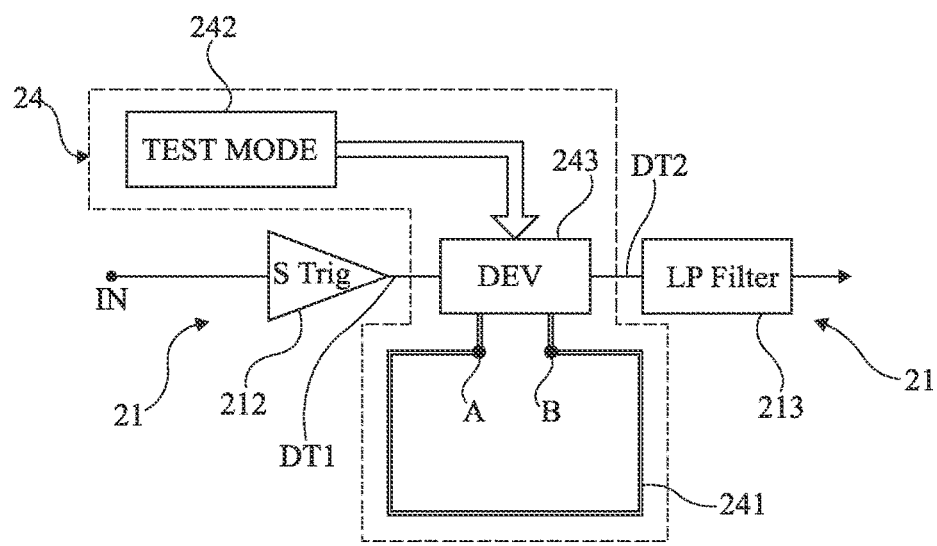
FIG. 3 schematically shows a block diagram of an embodiment of a test circuit.

Signal transmit and receive circuits 21 are circuit adapted to receiving data signals external to integrated circuit 20. Circuits 21 may comprise, for example, a wire connector, a wireless communication unit, data signal processing circuits, analog-to-digital and/or digital-to-analog converters, etc. Circuits 21 are shown as a single block in FIG. 2 but, as a variant, circuits 21 may be divided into a plurality of entities as illustrated in FIG. 3.

Integrated circuit 20 further comprises one or a plurality of electronic components or circuits 23 (FCT) enabling to implement the different functionalities of integrated circuit 20. As an example, components 23 may comprise a microcontroller, conversion circuits, memories, etc. According to another example, components 23 may optionally comprise circuits adapted to verifying the compliance of a signal received by circuits 21 before this signal is used by integrated circuit 20. These circuits for example enable to verify the voltage and/or current levels of a signal, to verify whether the signal exhibits a delay, whether the signal effectively transmits data, etc.

Integrated circuit 20 further comprises an end-of-manufacturing test circuit, or test unit, 24, adapted to implementing an operation of verification of integrated circuit 20 at the end of the manufacturing. Test unit 24 comprises:
  a conductive track 241;
  a test mode control circuit 242 (TEST MODE); and
  a test mode activation circuit 243 (DEV).

Conductive track 241 extends over the periphery of circuit 20, preferably over all or the most part of the periphery of circuit 20. More particularly, track 241 is arranged on the front surface of the substrate on the side of which the integrated circuit is formed, and surrounds the circuits forming circuit 20, the assembly of circuits forming circuit 20 being delimited by dotted lines in FIG. 2. Thus, track 241 is the first portion of circuit 20 that may be damaged by a chipping torn off during an end-of-manufacturing individualization step. The use of a track of this type is also described in the U.S. Pat. No. 7,583,093.

The test mode control circuit 242 is a circuit having the functionality of triggering, or not, a test mode where integrated circuit 20 verifies whether a chipping has damaged conductive track 241. Circuit 242 supplies circuit 243 with control signals testmode enabling to trigger and to control the test mode. According to an embodiment, control signals testmode may comprise:
  a main test mode signal during which the integrated circuit stops all its operation to verify whether it is intact; and
  subsidiary test mode control signals enabling to trigger more specific test phases during a general test mode.

Activation circuit 243 is adapted to receiving an input data signal DT1 received by circuits 21 and to using it during a test mode to verify whether conductive track 241 has been damaged. More particularly, when a test mode is triggered by control circuit 242, activation circuit 243 receives signal DT1 and conducts the signal DT1 to (or deviates or directs the signal DT1 to or causes the signal DT1 to be sent or transmitted to) conductive track 241 which is connected to nodes A and B of circuit 243. Signal DT1 may then be modified during its running through conductive track 241 which then delivers, for example, via circuit 243, a modified input data signal DT2 to components 23.

Components 23 use signal DT2 as if it had been signal DT1. The malfunctions of components 23, and of integrated circuit 20 in general, enable to determine the modifications of signal DT1 after its passage through conductive track 241. As an example, if conductive track 241 is cut by the tearing off of a chipping, signal DT2 may no longer transmit data or does not reach components 23.

Examples of circuits 243 are described in relation with FIGS. 3 to 11.

According to an embodiment, transmit and receive circuits 21 may be arranged between test unit 24 and components 23 as illustrated in relation with FIG. 3.

FIG. 3 schematically shows in the form of blocks an example of connection of test unit 24 to signal transmit and receive circuits 21.

In the example of FIG. 3, signal DT1 is transmitted to integrated circuit 20 by an I2C-type bus. In this case, circuits 21 comprise an input node IN, a Schmitt trigger 212 (S. Trig), and a low-pass filter 213 (LP Filter). Input signal DT1 is, first, received on input node IN and is then submitted a first processing by Schmitt trigger 212, and then to a second processing by low-pass filter 213.

Activation circuit 243 may be arranged at different points in the chain for receiving signal DT1. According to an example, circuit 243 may be arranged between flip-flop 212 and filter 213.

Figure 4:
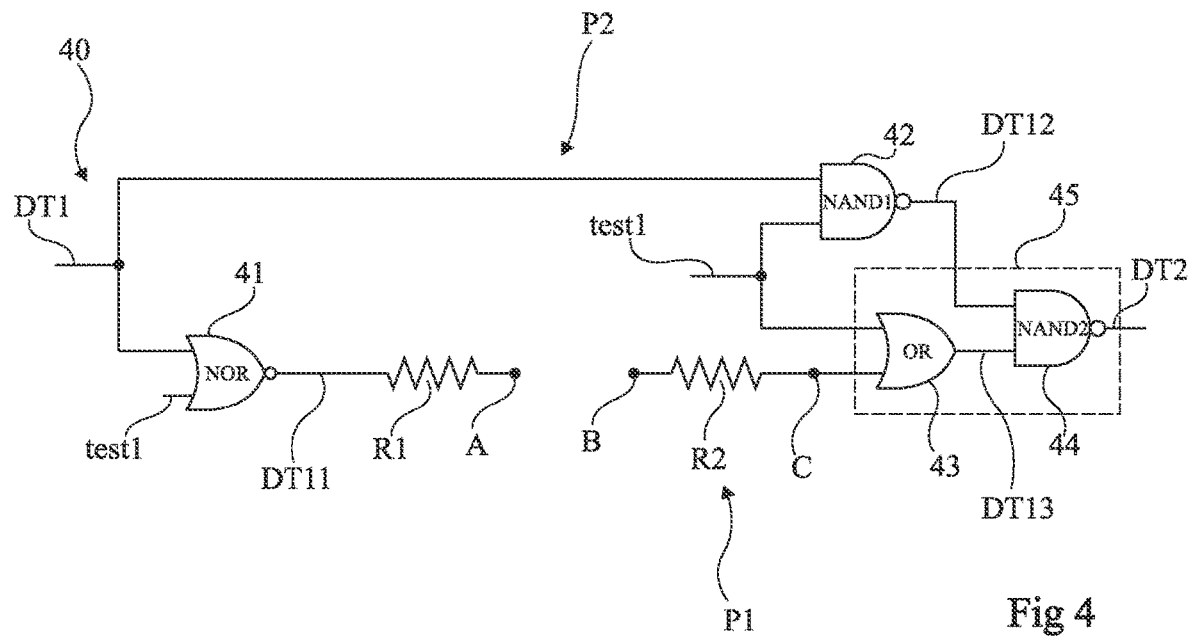
FIG. 4 shows in further detail a portion of the test circuit of FIG. 3.

FIG. 4 shows an electronic diagram of an embodiment of an activation circuit 40 of the type of the activation circuit 243 described in relation with FIGS. 2 and 3.

Circuit 40 comprises:

a logic NOR-type gate 41 (NOR);

a logic NAND-type gate 42 (NAND1); and a logic OR-AND-INVERT-type gate 45 (OAI) formed of a logic OR-type gate 43 (OR) and a logic NAND-type gate 44 (NAND2).

Each logic gate 41, 42, 43, 44 comprises two inputs and one output.

Circuit 40 is controlled by a test mode signal test1 supplied by a circuit (not shown in FIG. 4) of the type of the test mode control circuit 242 described in relation with FIG. 2. Signal test1 defines whether a test mode of circuit 20 is triggered or not.

Logic gate 41 comprises a first input which receives signal DT1, a second input which receives test mode triggering signal test1, and an output which delivers a signal DT11.

Logic gate 42 comprises a first input that receives signal DT1, a second input that receives signal test1, an output that delivers a signal DT12.

Logic gate 43 comprises a first input that receives signal test1, a second input coupled to a node C that receives signal DT11, and an output that delivers a signal DT13.

Logic gate 44 comprises a first input that receives the output of gate 42, that is, signal DT12, a second input that receives the output of gate 43, that is, signal DT13, and an output that delivers a modified signal DT2 to be analyzed.

Circuit 40 may further comprise two resistors R1 and R2 arranged on either side of two nodes A and B having a conductive track of the type of the conductive track 241 described in relation with FIG. 2 coupled therebetween. Resistors R1 and R2 are optional, and have the function of filtering electrostatic discharges capable of occurring at the level of nodes A and B.

According to an example, the terminal of resistor R1 is coupled, preferably connected, to the output of gate 41, and its other terminal is coupled, preferably connected, to node A. A terminal of resistor R2 is coupled, preferably connected, to node B and its other terminal is coupled, preferably connected, to node C.

In the case where circuit 40 does not comprise resistors R1 and R2, node A is coupled, preferably connected, to the output of gate 41, and node B is coupled, preferably connected, to node C, that is, to an input of gate 43.

Circuit 40 comprises a first path P1 and a second path P2. Path P1 comprises gates 41, 43, and 44, and the conductive track, while path P2 comprises gates 42 and 44.

Circuit 40 is controlled by signal test1. When signal test1 is at a low level, also called logic zero (0), the passing of signal DT1 through path P1 is allowed by gate 41 while the passing through path P2 is blocked by gate 42. Conversely, when signal test1 is at a high level, also called logic one (1), the passing of signal DT1 through path P1 is blocked by gate 41 while the passing through path P2 is allowed by gate 42

Table 1 hereafter sums up the states of signals test1, DT1, DT11, DT12, DT13, and DT2 during a test mode (Test) where signal test1 is at a low level (0), and during a normal operating mode (Normal) where signal test1 is at a high level (1). The values given herein are the values obtained when the conductive track is not damaged.

TABLE 1

| Mode | test1 | DT1 | DT11 | DT12 | DT13 | DT2 |
|---|---|---|---|---|---|---|
| Test | 0 | 0 | 1 | 1 | 1 | 0 |
| Test | 0 | 1 | 0 | 1 | 0 | 1 |
| Normal | 1 | 0 | 0 | 1 | 1 | 0 |
| Normal | 1 | 1 | 0 | 0 | 1 | 1 |

At its coming out of circuit 40, signal DT2 is sent to components 23. Components 23 use signal DT2 for their normal operation. If conductive track 241 has been damaged, then signal DT2 will be different from signal DT1 and will not allow a conventional operation of integrated circuit 20. Possible malfunctions generated by the use of signal DT2 instead of signal DT1 then enable to determine the damage to the conductive track, for example, a defect or even a cutting of the conductive track, which will modify its impedance or will create a current leakage.

Figure 5:
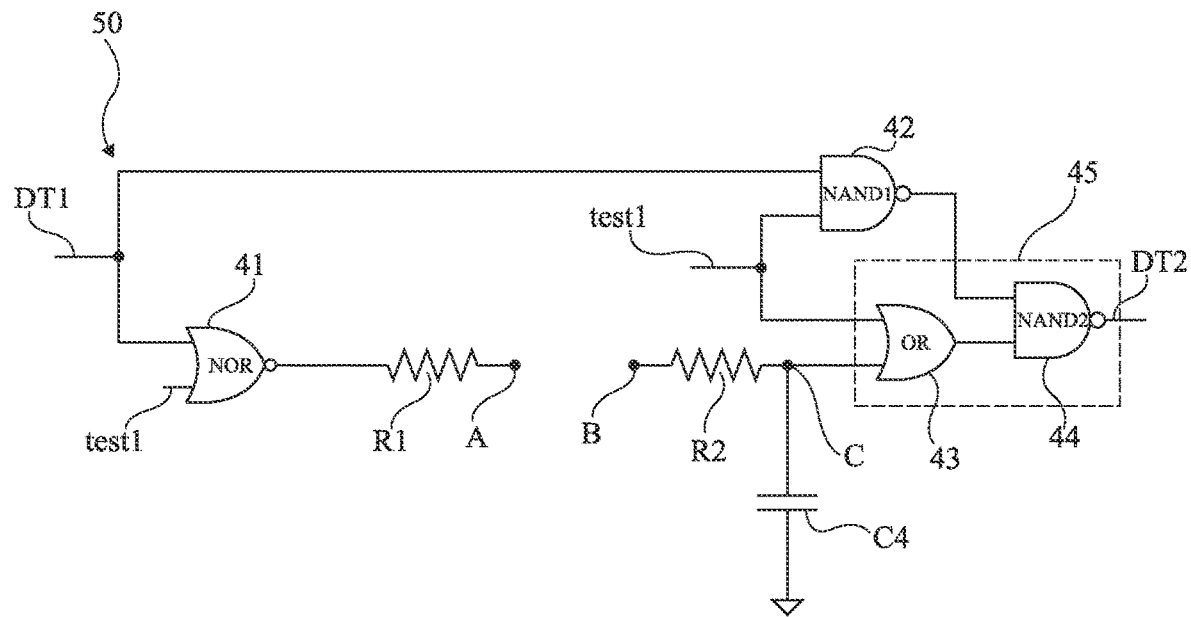
FIG. 5 shows in further details a variant of the portion of the test circuit of FIG. 3.

FIG. 5 shows an electronic diagram of an embodiment of an activation circuit 50 of the type of the activation circuit 243 described in relation with FIGS. 2 and 3.

Activation circuit 50 is similar to the activation circuit 40 described in relation with FIG. 4. The elements common to activation circuits 50 and 40 will not be described again, and only their differences will be highlighted.

Activation circuit 50 further comprises a capacitor C4. A terminal of capacitor C4 is coupled, preferably connected, to a node C corresponding to the input of gate 43 coupled, for example, via resistor R2, to node B. The other terminal of capacitor C4 is coupled, preferably connected, to a node receiving a reference potential, for example, the ground (Ground).

Capacitor C4 aims at amplifying a possible delay taken by data signal DT1 at the output of the conductive track due, for example, to a modification of the general resistance of the conductive track. Capacitor C4 thus enables to improve the chances of components 23 of detecting this possible delay.

Figure 6:
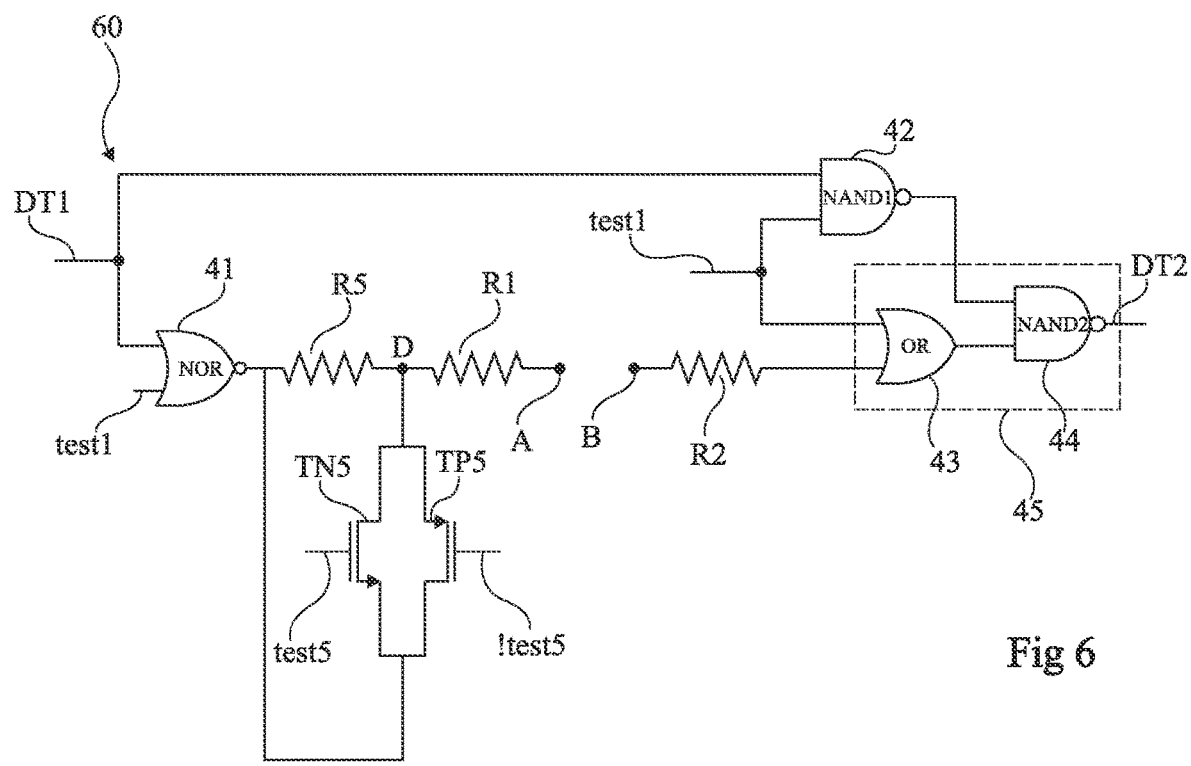
FIG. 6 shows in further details another variant of the portion of the test circuit of FIG. 3.

FIG. 6 shows an electronic diagram of an embodiment of an activation circuit 60 of the type of the activation circuit 243 described in relation with FIGS. 2 and 3.

Activation circuit 60 is similar to the activation circuit 40 described in relation with FIG. 4. The elements common to activation circuits 60 and 40 will not be described again, and only their differences will be highlighted.

Activation circuit 60 further comprises a resistor R5 selectable via two transistors TN5 and TP5. Resistor R5 is positioned between gate 41 and node A, for example, between gate 41 and resistor R1 when it is present. In other words, a first terminal of resistor R5 is coupled, preferably connected, to the output of gate 41, and its second terminal is coupled to node A, for example, via resistor R1, at the first terminal of resistor R1, noted node D. Resistor R5 is a resistor having a high impedance, for example, in the range from 1 kOhm to 50 MOhm, for example, in the order of 1 MOhm.

Transistors TN5 and TP5 are positioned to be able to short resistor R5 when they are conductive. Thus, transistors TN5 and TP5 are connected in parallel between the output of logic gate 41 and node D. Transistor TN5 is, for example, an N-type MOS transistor, and its gate is controlled by a signal test5. Transistor TP5 is for example a P-type MOS transistor, and its gate is controlled by a signal !test5 corresponding to the complementary of signal test5. Signals test5 and !test5 are generated by a circuit of the type of the test mode control circuit 242 described in relation with FIG. 2.

In other words, for a current to flow through resistor R5, transistors TN5 and TP5 must be clamped to be considered as off switches. When signal test5 is in a low state, transistor TN5 is clamped. Signal !test5 then is in a high state and transistor TP5 is also clamped. Conversely, for a current not to flow through resistor R5, transistors TN5 and TP5 should be conductive. When signal test5 is in a high state, transistor TN5 is conductive. Signal !test5 then is in a low state and transistor TP5 is also conductive.

An advantage of resistor R5 is that it enables, during a test mode, to amplify the influence of possible current leakages generated by damage on the conductive track, and thus to make them more easily detectable by components 23. More particularly, a current leakage generated by damage on the conductive track causes an increase in the current flowing through resistor R5. This results in a voltage drop in resistor R5, which will attenuate the amplitude of the signal at the output of conductive track 241. This attenuation may result in a delay of signal DT2 with respect to signal DT1 or may prevent signal DT2 from changing voltage level. Resistor R5 enables to amplify the voltage drop of signal DT2 with respect to signal DT1 and thus to improve the detectability of this voltage drop.

Another advantage of this embodiment is that it enables to activate and to deactivate resistor R5 during different phases of the test mode.

Figure 7:
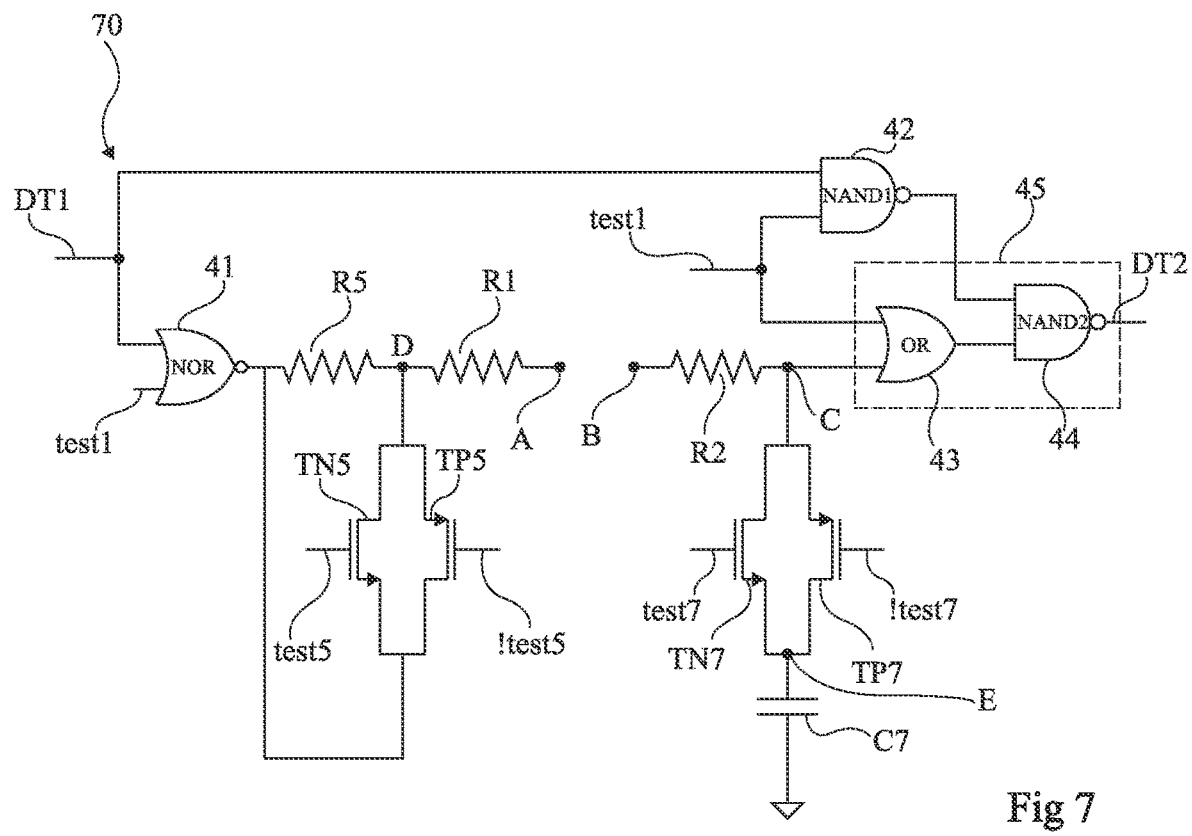
FIG. 7 shows in further details another variant of the portion of the test circuit of FIG. 3.

FIG. 7 shows an electronic diagram of an embodiment of an activation circuit 70 of the type of the activation circuit 243 described in relation with FIGS. 2 and 3.

Activation circuit 70 comprises elements common with the circuit 60 described in relation with FIG. 6. The elements common to activation circuits 60 and 70 will not be described again, and only their differences will be highlighted.

More particularly, circuit 70 further comprises a capacitor C7 selectable via two transistors TN7 and TP7.

Capacitor C7 has a first terminal coupled, preferably connected, to a node E, and a second terminal coupled, preferably connected, to a node receiving a reference potential, for example, the ground.

Transistors TN7 and TP7 are connected in parallel between node C and node E. Transistor TN7 is for example an N-type MOS transistor and its gate is controlled by a signal test7. Transistor TP7 is for example a P-type MOS transistor, and its gate is controlled by a signal !test7 corresponding to the complementary of signal test7. Signals test7 and !test7 are generated by a circuit of the type of the test mode control circuit 242 described in relation with FIG. 2. Transistors TN7 and TP7 are positioned to be able to disconnect capacitor C7 when they are off, and to connect capacitor C7 when they are on.

Signals test7 and !test7 are different from signals test5 and !test5. Indeed, the activation of resistor R5 and of capacitor C7 at the same time during a test phase may introduce an additional delay of signal DT2 with respect to signal DT1. Indeed, a phenomenon equivalent to the response of an RC-type electronic circuit may add an additional delay to signal DT2. It would then be difficult for components 23 to determine the origin of a delay on signal DT2.

An advantage of this embodiment is that capacitor C7 enables, during a test mode, to improve the detectability of an impedance increase of the conductive track. More particularly, the addition of capacitor C7 enables to increase a possible delay of signal DT2 with respect to signal DT1 by an RC-type effect. Indeed, in an RC-type circuit (Resistor Capacitor), the time delay is defined by the multiplication of the resistance by the capacitance, by adding the capacitance of capacitor C7, the delay is increased.

Figure 8:
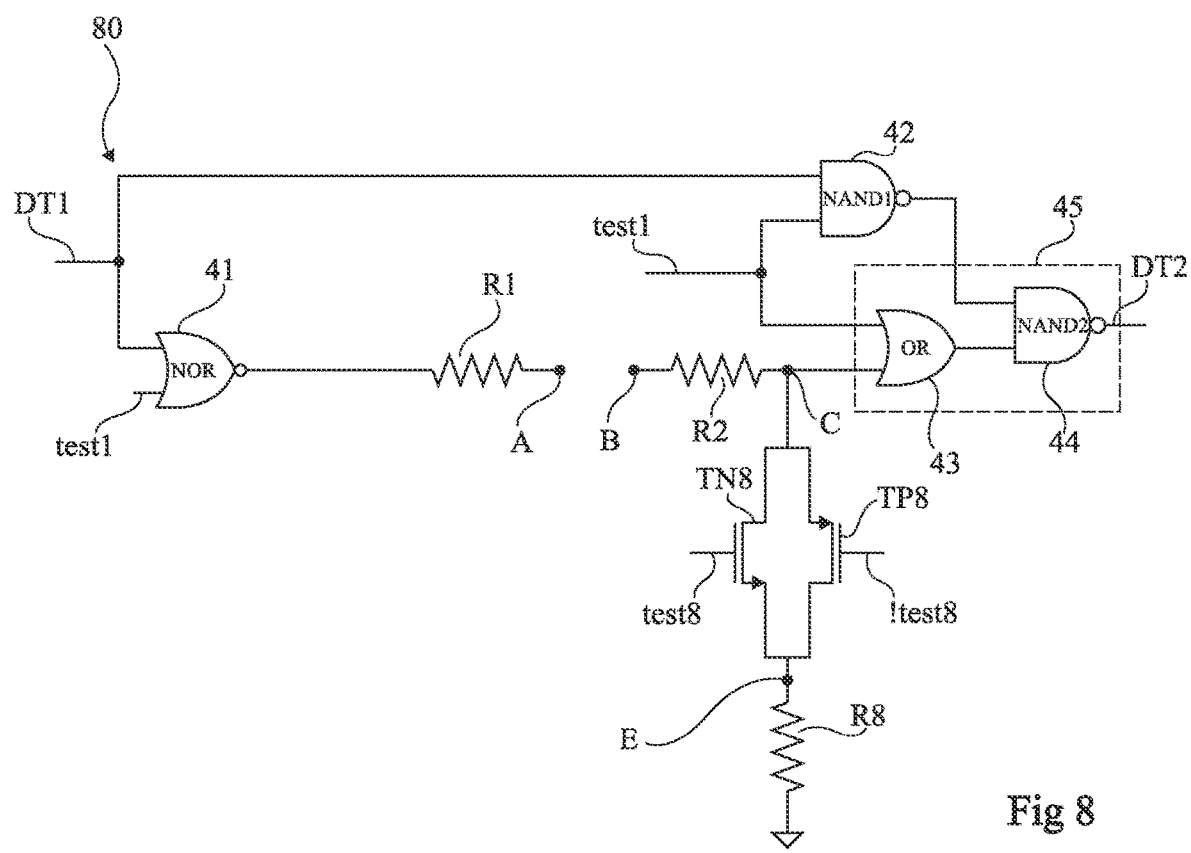
FIG. 8 shows in further details another variant of the portion of the test circuit of FIG. 3.

FIG. 8 shows an electronic diagram of an embodiment of an activation circuit 80 of the type of the activation circuit 243 described in relation with FIGS. 2 and 3.

Activation circuit 80 is similar to the activation circuit 40 described in relation with FIG. 4. The elements common to activation circuits 80 and 40 will not be described again, and only their differences will be highlighted.

Activation circuit 80 further comprises a resistor R8 selectable via two transistors TN8 and TP8. Resistor R8 is positioned in the same way as the capacitor C7 described in relation with FIG. 7. Thus, a first terminal of resistor R8 is coupled to node E, and a second terminal of resistor R8 is coupled, preferably connected, to the node receiving the reference potential, for example, the ground.

Resistor R8 is selectable via the two transistors TN8 and TP8. Transistors TN8 and TP8 are positioned to be able to disconnect the resistor from node C when they are clamped. Thus, transistors TN8 and TP8 are connected in parallel between node C and node E. Transistor TN8 is for example an N-type MOS transistor, and its gate is controlled by a signal test8. Transistor TP8 is for example a P-type MOS transistor, and its gate is controlled by a signal !test8 corresponding to the complementary of signal test8. Signals test8 and !test8 are generated by a circuit of the type of the test mode control circuit 242 described in relation with FIG. 2.

An advantage of resistor R8 is that it enables to amplify the detectability of an increase of the impedance of the conductive track. More particularly, resistor R8 enables to amplify a decrease in the amplitude of signal DT2 at the output of the conductive track.

Figure 9:
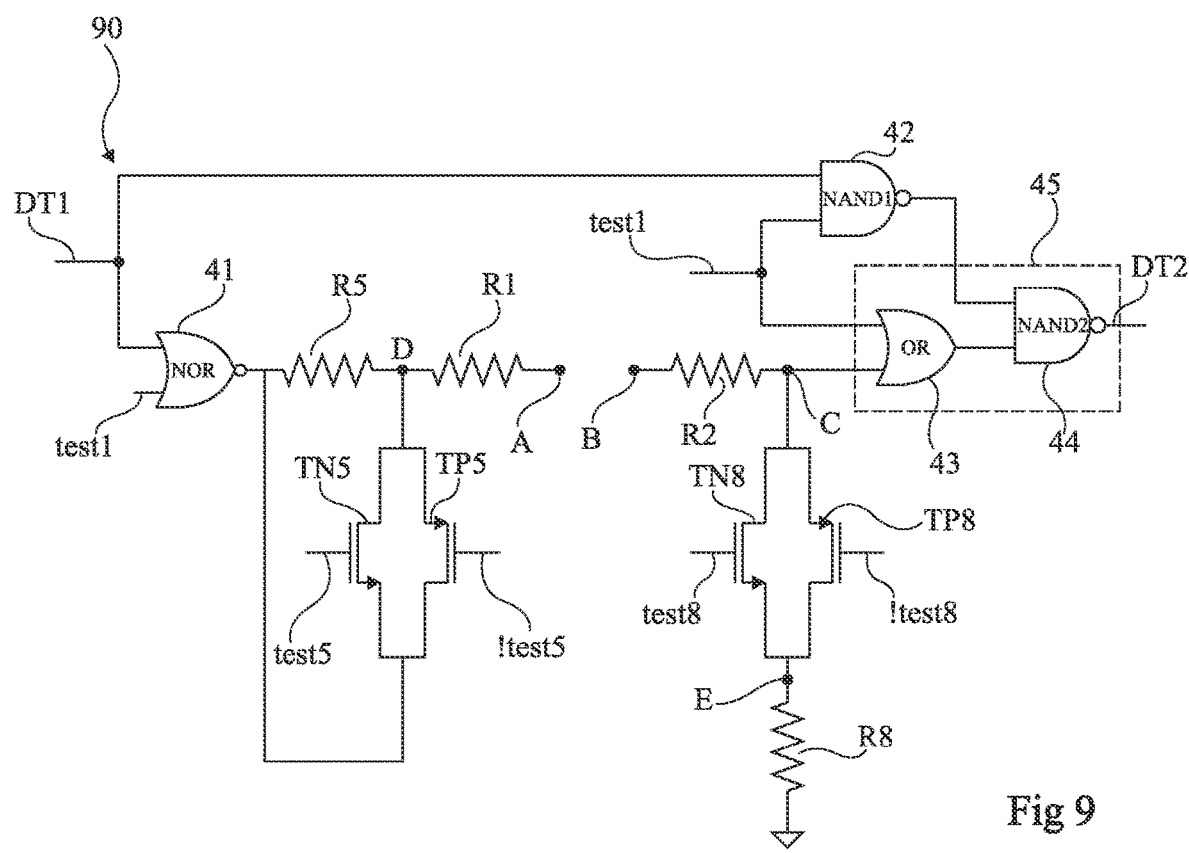
FIG. 9 shows in further details another variant of the portion of the test circuit of FIG. 3.

FIG. 9 shows an electronic diagram of an embodiment of an activation circuit 90 of the type of the activation circuit 243 described in relation with FIGS. 2 and 3.

Activation circuit 90 comprises, as compared with the circuit 40 described in relation with FIG. 4:
resistor R5 selectable by transistors TP5 and TN5 as described in relation with FIG. 6; and
resistor R8 selectable by transistors TP8 and TN8 as described in relation with FIG. 8.

Signals test5 and !test5 and signals test8 and !test8 are different but they may in practice be the same signals. Resistors R5 and R8 may be activated at the same time.

Figure 10:
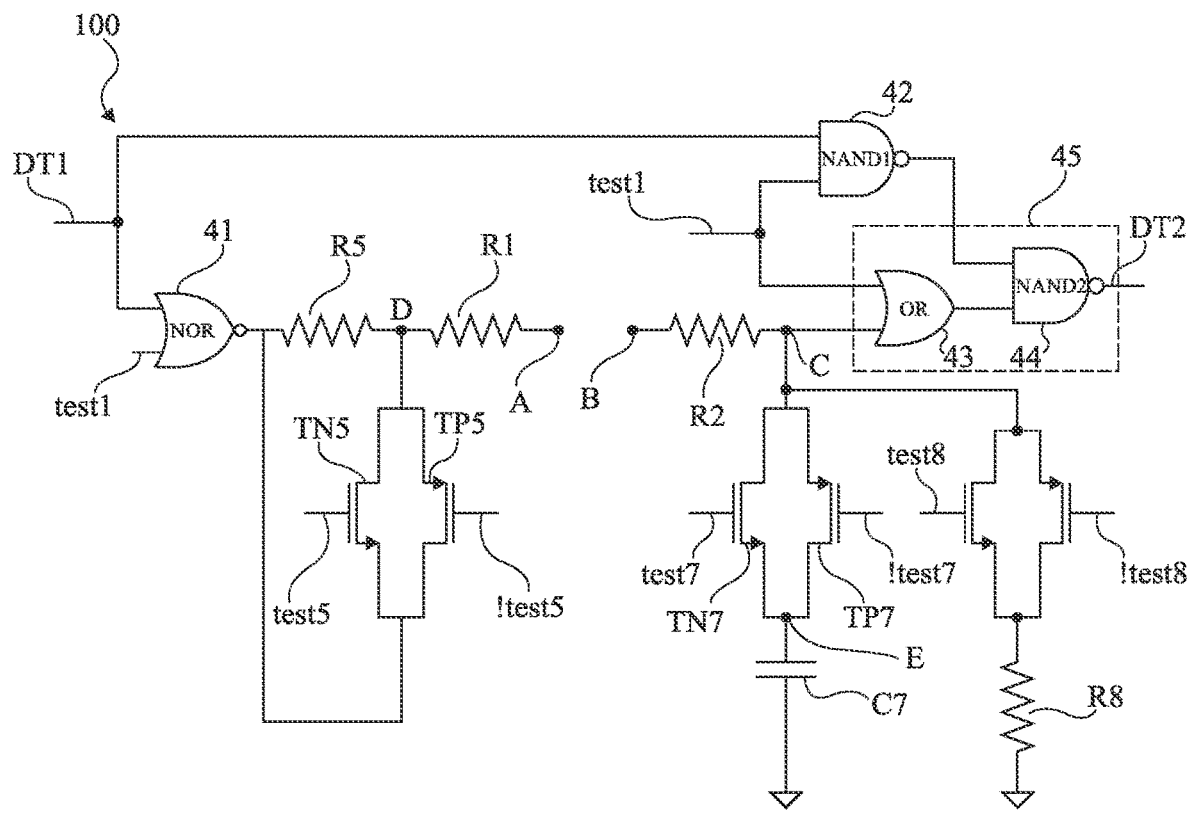
FIG. 10 shows in further details another variant of the portion of the test circuit of FIG. 3.

FIG. 10 shows an electronic diagram of an embodiment of an activation circuit 100 of the type of the activation circuit 243 described in relation with FIGS. 2 and 3.

Activation circuit 100 comprises, as compared with the circuit 40 described in relation with FIG. 4:
resistor R5 selectable by transistors TP5 and TN5 as described in relation with FIG. 6;
capacitor C7 selectable by transistors TP7 and TN7 as described in relation with FIG. 7; and
resistor R8 selectable by transistors TP8 and TN8 as described in relation with FIG. 8.

Signals test5 and !test5 and signals test8 and !test8 are different but they may in practice be the same signals. Resistors R5 and R8 may be activated at the same time. However, signals test5 and !test5 and signals test7 and !test7 are different, as described in relation with FIG. 7.

Figure 11:
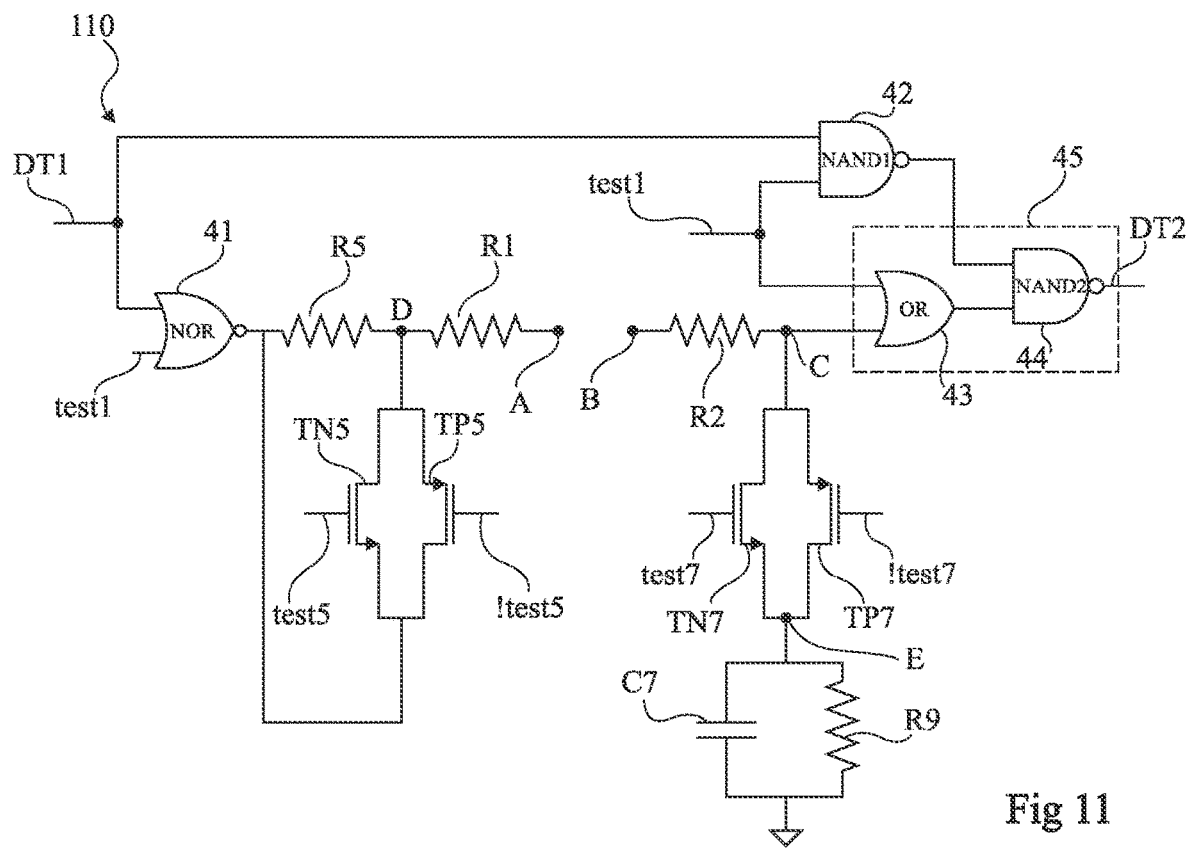
FIG. 11 shows in further details another variant of the portion of the test circuit of FIG. 3.

FIG. 11 shows an electronic diagram of an embodiment of an activation circuit 110 of the type of the activation circuit 243 described in relation with FIGS. 2 and 3.

Activation circuit 110 comprises, as compared with the circuit 40 described in relation with FIG. 4:

resistor R5 selectable by transistors TP5 and TN5 as described in relation with FIG. 6; and capacitor C7 selectable by transistors TP7 and TN7 as described in relation with FIG. 7.

Activation circuit 110 further comprises a resistor R9 arranged in parallel with capacitor C7. In other words, resistor R9 has a terminal coupled, preferably connected, to node E and has its other terminal coupled, preferably connected, to the node receiving the reference potential. Resistor R9 plays the same role as the resistor R8 described in relation with FIG. 8.

The embodiments described in relation with FIGS. 4 to 11 all have the advantage of only comprising few electronic circuits and thus of taking little space in an integrated circuit. As compared with other test circuits, the embodiments described in relation with FIGS. 4 to 11 are further simple to implement since they only require little space on an integrated circuit, all the more as they adapt to any types of components 23.

Various embodiments and variants have been described. Those skilled in the art will understand that certain features of these various embodiments and variants may be combined, and other variants will occur to those skilled in the art.

Finally, the practical implementation of the described embodiments and variations is within the abilities of those skilled in the art based on the functional indications given herein.

An integrated circuit (20) may be summarized as including a test circuit (24) including a conductive track (241) extending over at least a portion of the periphery of said integrated circuit (20); at least one component (23); and an activation circuit (243; 40; 50; 60; 70; 80; 90; 100; 110) adapted to deviating an input data signal (DT1) into said conductive track (241) during a test mode, and to transmitting the input data signal (DT1) to said at least one component (23) during a normal operating mode.

The integrated circuit may further include an input node (IN) receiving the input data signal (DT1).

The activation circuit (243) may include a first node (A) and a second node (B), said conductive track (241) being coupled between the first node (A) and the second node (B).

The activation circuit (243) may include a capacitor (C4) arranged between the second node (B) and a node receiving a reference potential.

The capacitor (C4) may be selectable via at least one transistor (TN4, TP4).

The activation circuit (243) may further include a first resistor (R5) series-coupled with the conductive track (241).

The first resistor (R5) may be selectable via at least one transistor (TN5, TP5).

The activation circuit (243) may include a second resistor (R8) arranged between the second node (B) and a node receiving a reference potential.

The second resistor (R8) may be selectable via at least one transistor (TN8, TP8).

The integrated circuit may further include a test mode triggering circuit (242).

The test mode triggering circuit (242) may be adapted to delivering a test mode signal (test1) to the activation circuit (243).

The test mode triggering circuit (242) may be adapted to delivering at least one test control signal (test5, !test5; test7, !test7; test8, !test8) to the activation circuit (243).

The test circuit (24) may be further capable of detecting physical damage on the conductive track (241).

A method of operation of an integrated circuit may be summarized as including the steps of deviating an input data signal (DT1) into a conductive track (241) extending over at least a portion of the periphery of said integrated circuit 20 during a test mode; and transmitting the input data signal (DT1) to at least one component (23) of the integrated circuit (20) during a normal operating mode.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An integrated circuit, comprising:
    a conductive track extending over at least a portion of a periphery of the integrated circuit;
    at least one component; and
    a test circuit including:
        an activation circuit configured to:
            divert an input data signal, that carries data for the at least one component, to the conductive track during a test mode; and
            send the input data signal to the at least one component during an operating mode.

2. The integrated circuit according to claim 1, comprising:
    an input node configured to receive the input data signal.

3. The integrated circuit according to claim 1, wherein the activation circuit includes:
    a first node and a second node, the conductive track being coupled between the first node and the second node.

4. The integrated circuit according to claim 3, wherein the activation circuit includes:
    a capacitor arranged to be coupled between the second node and a node that is configured to receive a reference voltage.

5. The integrated circuit according to claim 4, wherein the capacitor is selectively coupled between the second node and the node that is configured to receive the reference voltage by at least one transistor.

6. The integrated circuit according to claim 1, wherein the activation circuit includes:
    a first resistor arranged to be coupled in series with the conductive track.

7. The integrated circuit according to claim 6, wherein the first resistor is selectively coupled to the conductive track via at least one transistor.

8. The integrated circuit according to claim 3, wherein the activation circuit includes:
    a second resistor arranged to be coupled between the second node and a node configured to receive a reference voltage.

9. The integrated circuit according to claim 8, wherein the second resistor is selectively coupled between the second node and the node configured to receive the reference voltage by at least one transistor.

10. The integrated circuit according to claim 1, comprising:
    a test mode triggering circuit.

11. The integrated circuit according to claim 10, wherein the test mode triggering circuit is configured to send a test mode signal to the activation circuit.

12. The integrated circuit according to claim 10, wherein the test mode triggering circuit is configured to send at least one test control signal to the activation circuit.

13. The integrated circuit according to claim 1, wherein the test circuit is configured to:

detect physical damage to the conductive track.

14. A method, comprising:

during a test mode, causing an input data signal, that carries data for at least one component of an integrated circuit, to deviate to a conductive track extending over at least a portion of a periphery of the integrated circuit; and during an operating mode, transmitting the input data signal to the at least one component of the integrated circuit-.

15. The method according to claim 14, comprising:

sending a test mode signal to an activation circuit of the integrated circuit; and sending at least one test control signal to the activation circuit.

16. The method according to claim 14, comprising:

detecting physical damage to the conductive track.

17. A circuit, comprising:

an input;

a first output;

a second output; and an activation circuit configured to:

receive, over the input, a data signal that carries data for at least one component of the circuit;

determine whether to operate in a test mode or an operating mode;

in response to determining to operate in the test mode, divert, over the first output, the data signal to a conductive track of the circuit; and in response to determining to operate in the operating mode, output, over the second output, the data signal to the at least one component.

18. The circuit according to claim 17, wherein the activation circuit includes:

a first resistor arranged to be coupled in series with the conductive track.

19. The circuit according to claim 18, wherein the first resistor is selectively coupled to the conductive track via at least one transistor.

20. The circuit according to claim 17, wherein the circuit is configured to detect physical damage to the conductive track.

* * * * *